US006781861B2

(12) United States Patent
Gomm et al.

(10) Patent No.: US 6,781,861 B2
(45) Date of Patent: Aug. 24, 2004

(54) METHOD AND APPARATUS FOR DETERMINING DIGITAL DELAY LINE ENTRY POINT

(75) Inventors: Tyler J. Gomm, Meridian, ID (US); Aaron M. Schoenfeld, Boise, ID (US); Travis E. Dirkes, Boise, ID (US); Ross E. Dermott, Los Angeles, CA (US)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 10/424,508

(22) Filed: Apr. 28, 2003

(65) Prior Publication Data

US 2003/0189866 A1 Oct. 9, 2003

Related U.S. Application Data

(63) Continuation of application No. 09/923,136, filed on Aug. 6, 2001, now Pat. No. 6,556,489.

(51) Int. Cl.[7] .............................. G11C 7/00; H03L 7/06
(52) U.S. Cl. .................. 365/144; 365/233; 365/189.12; 365/236; 327/156
(58) Field of Search ................................. 365/194, 233, 365/189.12, 236, 241, 240; 327/156, 158, 141

(56) References Cited

U.S. PATENT DOCUMENTS

| 5,963,069 A | 10/1999 | Jefferson et al. .............. 327/12 |
| 6,067,272 A | 5/2000 | Foss et al. ................... 365/194 |
| 6,087,868 A | 7/2000 | Millar ........................ 327/156 |
| 6,215,726 B1 | 4/2001 | Kubo .......................... 327/141 |
| 6,483,771 B2 * | 11/2002 | Shin ............................ 365/233 |

* cited by examiner

Primary Examiner—David Lam
(74) Attorney, Agent, or Firm—Fletcher Yoder (57) ABSTRACT

A method and apparatus to characterize a synchronous device after it is packaged. For synchronous devices, such as SDRAMs implementing a Delay Locked Loop (DLL) to synchronize one signal, such as an external clock signal with a second signal, such as a data signal, a counter is coupled to the phase detector of the DLL to track the entry point of the delay line. The entry point information can be taken over a variety of voltages, temperatures, and frequencies to characterize the DLL. The counter may be located on the synchronous device or external to the device.

27 Claims, 5 Drawing Sheets

METHOD AND APPARATUS FOR DETERMINING DIGITAL DELAY LINE ENTRY POINT

This application is a continuation of U.S. application Ser. No. 09/923,136, filed Aug. 6, 2001 now U.S. Pat. No. 6,556,489.

BACKGROUND OF THE INVENTION

1. Field of the Invention

The present invention relates generally to memory devices and, more particularly, to characterization of memory devices which implement a delay locked loop to synchronize input signals to the memory devices.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device which is coupled to the microprocessor. Not only does the microprocessor access memory devices to retrieve the program instructions, but it also stores and retrieves data created during execution of the program in one or more memory devices.

There are a variety of different memory devices available for use in microprocessor-based systems. The type of memory device chosen for a specific function within a microprocessor-based system generally depends upon which features of the memory are best suited to perform the particular function. Memory manufacturers provide an array of innovative fast memory chips for various applications, including Dynamic Random Access Memories (DRAM), which are lower in cost but have slower data rates, and Static Random Access Memories (SRAM), which are more costly but offer higher data rates. Although both DRAMs and SRAMs are making significant gains in speed and bandwidth, even the fastest memory devices cannot match the speed requirements of most microprocessors. Regardless of the type of memory, the solution for providing adequate memory bandwidth depends on system architecture, the application requirements, and the processor, all of which help determine the best memory type for a given application. Limitations on speed include delays in the chip, the package, and the system. Thus, significant research and development has been devoted to finding faster ways to access memory and to reduce or hide latency associated with memory accesses.

Because microprocessor technology enables current microprocessors to operate faster than current memory devices, certain techniques for increasing the speed of memory devices are often implemented. For example, one type of memory device that can contribute to increased processing speeds in the computer system is a Synchronous Dynamic Random Access Memory (SDRAM). An SDRAM differs from a standard DRAM in that the SDRAM includes input and output latches to hold information from and for the processor under the control of (i.e., synchronous with) the system clock. Because input information (i.e., addresses, data, and controls signals) is latched, the processor may perform other tasks while waiting for the SDRAM to finish its task, thereby reducing processor wait states. After a predetermined number of clock cycles during which the SDRAM is processing the processor's request, the processor may return to the SDRAM and obtain the requested information from the output latches.

A technique for increasing the speed of an SDRAM is to implement a Double Data Rate (DDR) SDRAM. In a DDR memory device, the data transfer rate is twice that of a regular memory device, because the DDR's input/output data can be strobed twice for every clock cycle. That is, data is sent on both the rising and falling edges of the clock signal rather than just the rising edge of the clock signal as in typical Single Data Rate (SDR) systems.

In high speed memory devices such as DDR SDRAMs, it is often desirable to synchronize the timing of certain signals, such as clock signals and data signals which may be external to the memory devices, with internally generated clock signals or data signals, or with other external signals. One means of synchronizing signals is by implementing a delay locked loop (DLL) circuit. The DLL circuit is used to create an output signal that is matched in terms of frequency and/or phase to the input signal, which may be an external clock signal, for example. In DLL circuits, an input buffer is used to receive an input signal and to transmit the signal to one or more delay lines. The delay line includes a number of delay elements. A phase detector may be used to compare the input clock signal to the output signal by using a feedback loop. The information can then be fed from the phase detector to a shift register to move through the delay elements in the delay line incrementally to search for a match. When the input signal and output signal are equal, as indicated by a phase difference which is essentially equal to zero (typically within +/−11 degrees), the signals are synchronized, and the DLL is considered locked.

It should also be understood that memory devices are typically mass produced by fabricating thousands of identical circuit patterns on a single semiconductor wafer and subsequently dividing them into identical die or chips. To produce the integrated circuit, many commonly known processes are used to modify, remove, and deposit material onto the semiconductor wafer, which is generally made of silicon. Once the active and passive parts are fabricated in and on the wafer surface, one or more layers of conductive material, such as metal, for electrically connecting circuit components are added, and a protective layer is deposited over the silicon wafer. The wafer is visually evaluated and electrically tested to determine which memory devices are good so that they may be packaged for use. After the memory devices are tested in wafer form, they may be separated through a sawing process. The electrically good die are generally packaged, and the packaged device may again be tested using various testing systems.

For memory devices which incorporate a DLL circuit, electrical testing and characterization of the DLL circuit is generally performed while the device is still in wafer form. As previously discussed, the delay lines incorporated in the DLL circuits generally include a number of delay elements. Depending on variables such as the input voltage, clock period, temperature, etc., the DLL may lock at a particular "entry point." The entry point refers to the location along the delay line, corresponding to some number of delay elements, at which a signal lock is achieved. The delay loop is locked when the difference between the phase of the input and the output of the delay line in the DLL is essentially zero. Because the devices may be produced to function over various frequency ranges, the entry point may change for a given signal. However, knowing the entry point of various devices over varying input voltages, for instance, for a given design provides designers with information to implement improvements and changes for various applications. For this reason, the DLL is typically tested using a tester and oscilloscope to track the entry point of each device while it is still in wafer form. The current method of entry point characterization requires direct access to the internal DLL signals, and thus dictates that the DLL be tested before it is packaged. Disadvantageously, this process is tedious and labor intensive due to the manual nature of the tests. Further, although testing the DLL while the device is still in wafer form may provide useful information, the characteristics of the DLL may change once the device is packaged.

The present invention may address one or more of the problems set forth above.

BRIEF DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
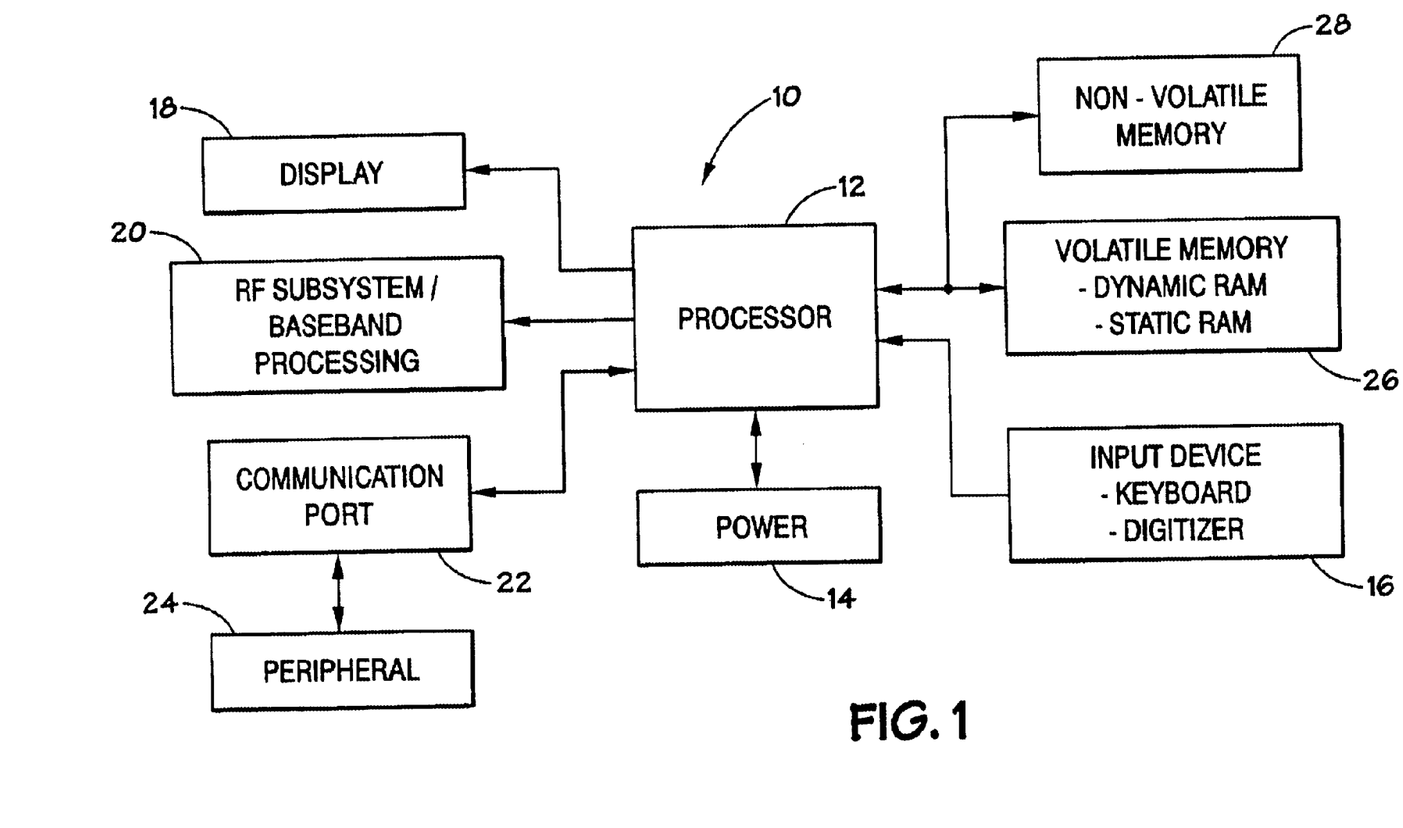
FIG. 1 illustrates a block diagram of an exemplary processor-based device which may incorporate the present technique.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include an input device, such as buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF sub system/baseband processor 20 may include an antenna that is coupled to an RF receiver and to an RF transmitter (not shown). A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the software program. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory 26, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

The volatile memory 26 may include a number of SDRAMs which implement DDR technology. As mentioned previously, the SDRAM differs from a DRAM in that the SDRAM is controlled synchronously with a timing source, such as the system clock. To accomplish synchronous control, latches are used to provide data and other information on the inputs and outputs of the SDRAM. Thus, in a read operation for example, the processor 12 may visit a data output latch at a predetermined number of clock cycles after issuing the read request. The predetermined number of clock cycles typically corresponds to the amount of time needed to access the requested data, move the data to the output latch, and allow the data to stabilize. The data is clocked out of the output latch synchronous with the system clock which provides the timing source for the processor 12. Synchronization of the data read from the output latch with the system clock is generally implemented via a delay locked loop (DLL) circuit, as previously discussed and as further discussed in more detail below. In general, the DLL locks the data output signal to the system clock by shifting the output data in time such that it is nominally aligned with the system clock. Thus, the DLL can compensate for timing delays introduced by various components in the SDRAM.

Write operations are also performed synchronously or in synchronization with a timing source, such as the system clock or other externally provided timing source. Thus, data may be clocked into an input latch and written to the memory array under control of a write clock provided from the external device which is performing the write operation. Delay locked loops may also be implemented to synchronize write data with the write clock.

Figure 2:
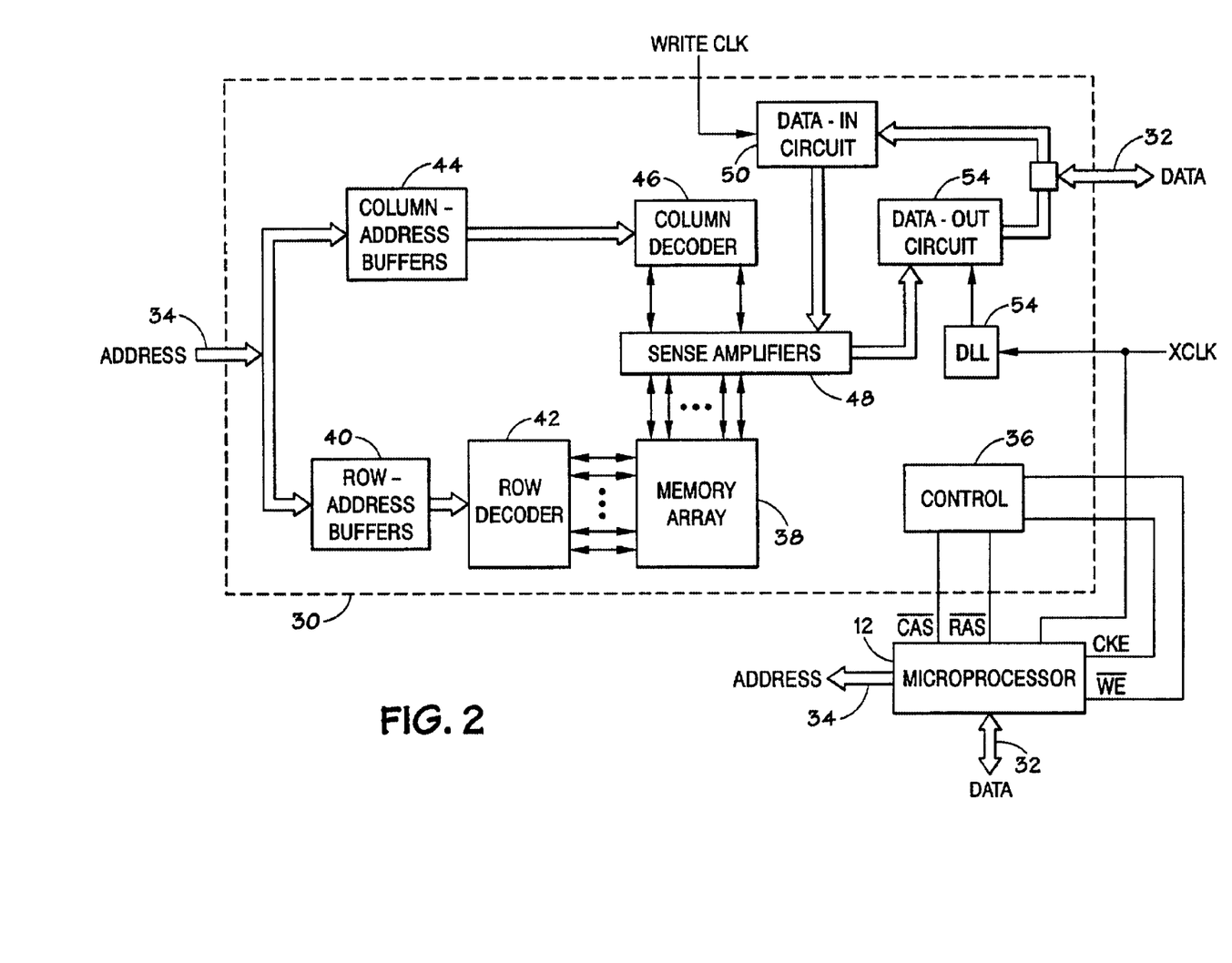
FIG. 2 illustrates a block diagram of an exemplary memory device which may be used in the processor-based device of FIG. 1.

Turning now to FIG. 2, a block diagram depicting an exemplary embodiment of a DDR SDRAM is illustrated. The description of the DDR SDRAM 30 has been simplified for illustrative purposes and is not intended to be a complete description of all features of a DDR SDRAM. The present technique may not be limited to DDR SDRAMs, and may be equally applicable to other synchronous memory devices, and other devices for use in communication applications, such as double-edge triggered applications, which may benefit from strict adherence to timing. Those skilled in the art will recognize that various devices may be used in the implementation of the present invention.

Control, address, and data information provided over a memory bus are represented by individual inputs to the DDR SDRAM 30. These individual representations are illustrated by a databus 32, address lines 34, and various discrete lines directed to control logic 36. As is known in the art, the SDRAM 30 includes a memory array 38 which comprises rows and columns of addressable memory cells. Each memory cell in a row is coupled to a word line. Additionally, each memory cell in a column is coupled to a bit line. Each cell in the memory array 38 typically includes a storage capacitor and an access transistor as is conventional in the art.

The SDRAM 30 interfaces with, for example, a processor 12, such as a microprocessor, through address lines 34 and data lines 32. Alternatively, the SDRAM 30 may interface with other devices, such as a SDRAM controller, a microcontroller, a chip set, or other electronic system. The microprocessor 12 also may provide a number of control signals to the SDRAM 30. Such signals may include row and column address strobe signals RAS and CAS, a write enable signal WE, a clock enable signal CKE, and other conventional control signals. The control logic 36 controls the many available functions of the SDRAM 30. In addition, various other control circuits and signals not detailed herein contribute to the operation of the SDRAM 30, as known to one of ordinary skill in the art.

A row address buffer 40 and a row decoder 42 receive and decode row addresses from row address signals provided on the address lines 34. Each unique row address corresponds to a row of cells in the memory array 38. The row decoder 42 typically includes a word line driver, an address decoder tree, and circuitry which translates a given row address received from row address buffers 40 and selectively activates the appropriate word line of the memory array 38 via the word line drivers.

A column address buffer 44 and a column decoder 46 receive and decode column address signals provided on the address lines 34. The column decoder 46 may also determine when a column is defective, as well as the address of a replacement column. The column decoder 46 is coupled to sense amplifiers 48. The sense amplifiers 48 are coupled to complementary pairs of bit lines of the memory array 38.

The sense amplifiers 48 are coupled to data-in (i.e., write) circuitry 50 and data-out (i.e., read) circuitry 52. The data-in circuitry 50 and the data-out circuitry 52 include data drivers and latches, as will be discussed in detail below. During a write operation, the data bus 32 provides data to the data-in circuitry 50. The sense amplifier 48 receives data from the data-in circuitry 50 and stores the data in the memory array 38 as a charge on a capacitor of a cell at an address specified on the address line 34. In one embodiment, the data bus 32 is an 8-bit data bus carrying data at 400 MHz or higher.

During a read operation, the SDRAM 30 transfers data to the microprocessor 12 from the memory array 38. Complementary bit lines for the accessed cell are equilibrated during a precharge operation to a reference voltage provided by an equilibration circuit and a reference voltage supply. The charge stored in the accessed cell is then shared with the associated bit lines. The sense amplifier 48 detects and amplifies a difference in voltage between the complementary bit lines. Address information received on address lines 34 selects a subset of the bit lines and couples them to complementary pairs of input/output (I/O) wires or lines. The I/O wires pass the amplified voltage signals to the data-out circuitry 52 and eventually out to the data bus 32.

The data-out circuitry 52 may include a data driver (not shown) to drive data out onto the data bus 32 in response a read request directed to the memory array 38. Further, the data-out circuitry 52 may include a data latch (not shown) to latch the read data until it is driven onto the data bus 32 by the data driver. The timing source for the data latch may be provided by a delay locked loop (DLL) circuit 54 which provides a shifted clock signal (DLLOUT) which is synchronous with the external system clock signal (XCLK), thus locking the output data signal (DATA) on the data bus 32 to the system clock.

Figure 3:
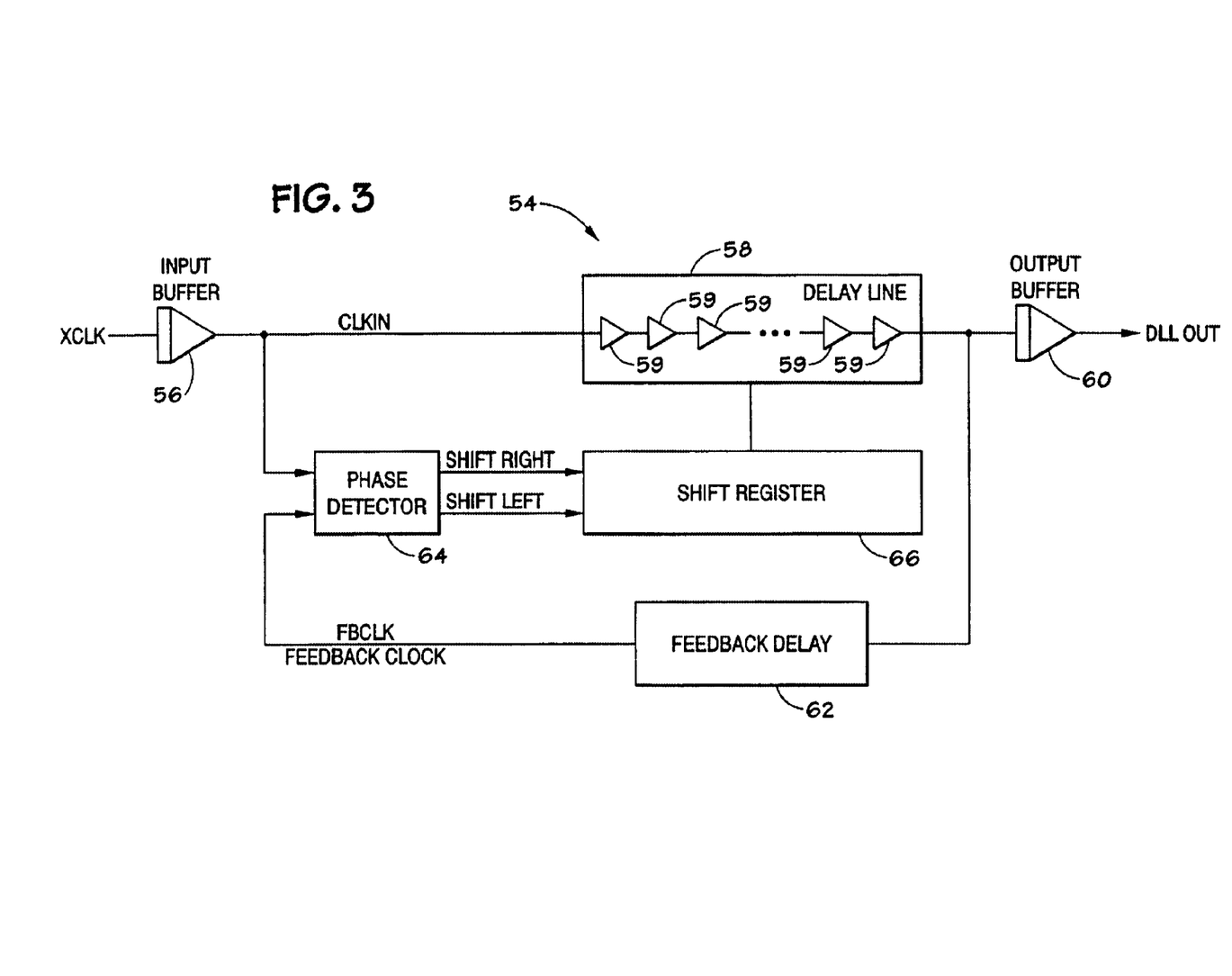
FIG. 3 illustrates a block diagram of a typical delay locked loop used to synchronize the output data from the memory device of FIG. 2 with the system clock.

An exemplary embodiment of a typical DLL circuit 54 is illustrated in FIG. 3. Differences in alignment between signals having the same frequency may arise due to propagation delays inherent in each of the various components in the system through which the signal of interest passes as well as propagation delays caused by varying lengths of signal buses in the system. For example, it may be desirable to drive various components in the system with a reference clock signal generated by an external source and to obtain an output signal from the driven components which is synchronous with the reference clock signal. To reach the various components, the reference clock signal may be transmitted through various buffers and buses of various lengths. Thus, when received at the input pin of a particular component, the clock signal may no longer be aligned (i.e., is out of phase) with the reference clock signal.

A conventional DLL, such as the DLL circuit 54, implements synchronization by forcing at least one of the edges of the clock signal for the data-out circuit 52 (FIG. 2) to align with a corresponding edge of the reference clock signal XCLK, thus locking the data output signal DATA to the reference clock signal. The DLL circuit 54 detects a phase difference between two signals and generates a corresponding feedback signal representative of the difference which is used to introduce or remove delay elements as needed to attain alignment of the data output signal DATA with the reference clock signal XCLK.

In the DLL circuit 54 illustrated in FIG. 3, a reference clock signal XCLK is received by an input buffer 56 and provided to a delay line 58 as a buffered clock signal CLKIN. The delay line 58 includes a number of delay elements 59, such as inverters. By providing a number of delay elements 59, the entry point of the buffered clock signal CLKIN may be adjusted to provide a lock through a range of frequencies, temperatures, input voltages, etc. The output of the delay line 58 is connected to an output buffer 60 and a feedback delay circuit 62. The feedback delay circuit 62 provides a feedback clock signal FBCLK which is transmitted to a phase detector 64 for comparison with the buffered reference clock signal CLKIN. The phase detector 64 determines whether a difference exists between the phase of the feedback clock signal FBCLK and the buffered reference clock signal CLKIN. The detected difference determines the amount of delay to be introduced in or removed from the delay line 58 by a delay line control, such as shift register 66, such that the buffered reference clock signal CLKIN may be shifted by an appropriate amount to produce an output clock signal DLLOUT that aligns, or locks, with the reference clock signal XCLK. While the present embodiment illustrates a shift register 66, any other suitable means of controlling the timing of the delay line 58, such as a state machine, a look-up table, a counter, etc. may be used.

When the DLL circuit 54 has locked the data output signal DLLOUT to the reference clock signal XCLK, then essentially no difference should exist between the phases of the buffered clock signal CLKIN and the clock feedback signal FBCLK. The degree of acceptable phase difference will depend on the application and the precision of the DLL (i.e., the number and size of the delay elements 59 included in the delay line 58). Thus, a DLL is locked when the total delay in the forward path is equal to the total delay in the feedback path. Expressed another way:

$$d_{forward} = t_{input\ buffer} + t_{delay\ line} + t_{output\ buffer};$$

$$d_{feedback} = t_{delay\ line} + t_{feedback};$$

$$d_{forward} = d_{feedback};$$

where $d_{forward}$ corresponds to the delay between the reference clock signal XCLK and the data output signal DLLOUT; $d_{feedback}$ corresponds to the delay in the feedback delay circuit; $t_{input\ buffer}$ corresponds to the delay of the input buffer 56; $t_{delay\ line}$ corresponds to the delay in the delay line 58; $t_{output\ buffer}$ corresponds to the delay of the output buffer 60; and $t_{feedback}$ corresponds to the delay in the feedback delay circuit 62. Thus, to achieve phase lock, $$t_{feedback} = t_{input\ buffer} + t_{output\ buffer}.$$

Thus, the feedback delay circuit 62 introduces delays in the feedback path corresponding to the delay ($t_{input\ buffer}$) introduced by the input buffer 56 and the delay ($t_{output\ buffer}$) introduced by the output buffer 60. Because $t_{feedback}$ is a constant, when the input changes frequency, the $t_{delay}$ line should change in response to the changing input. The phase detector 64 provides the shift register 66 with a shift left or shift right signal depending on whether the buffered clock signal CLKIN is too fast or too slow. The shift register 66 then shifts the entry point of the delay line 58 by one delay element 59. The process is repeated until the input signals to the phase detector 64 are phase equal and the DLL circuit 54 is locked.

During production of the SDRAMs 30, the DLL circuit 54 is often tested and characterized, as discussed in the Background, herein. As improvements are made in the delay line 58, the phase detector 64, and the shift register 66, timing and margin requirements become tighter. It is often beneficial to characterize memory devices incorporating DLL circuits to track the entry point of various designs over a range of temperatures, voltages, and frequencies, for example. By tracking the entry point of the delay line 58 through various design iterations, design improvements and changes directed towards specific applications can be implemented. For this reason, SDRAMs which incorporate DLL circuits are typically inspected and manually tested for entry point characterization while the device is still part of a wafer. However, because of certain characteristic changes which may be injected by the packaging of the device, it is more advantageous to characterize the device after it has been packaged.

Figure 4:
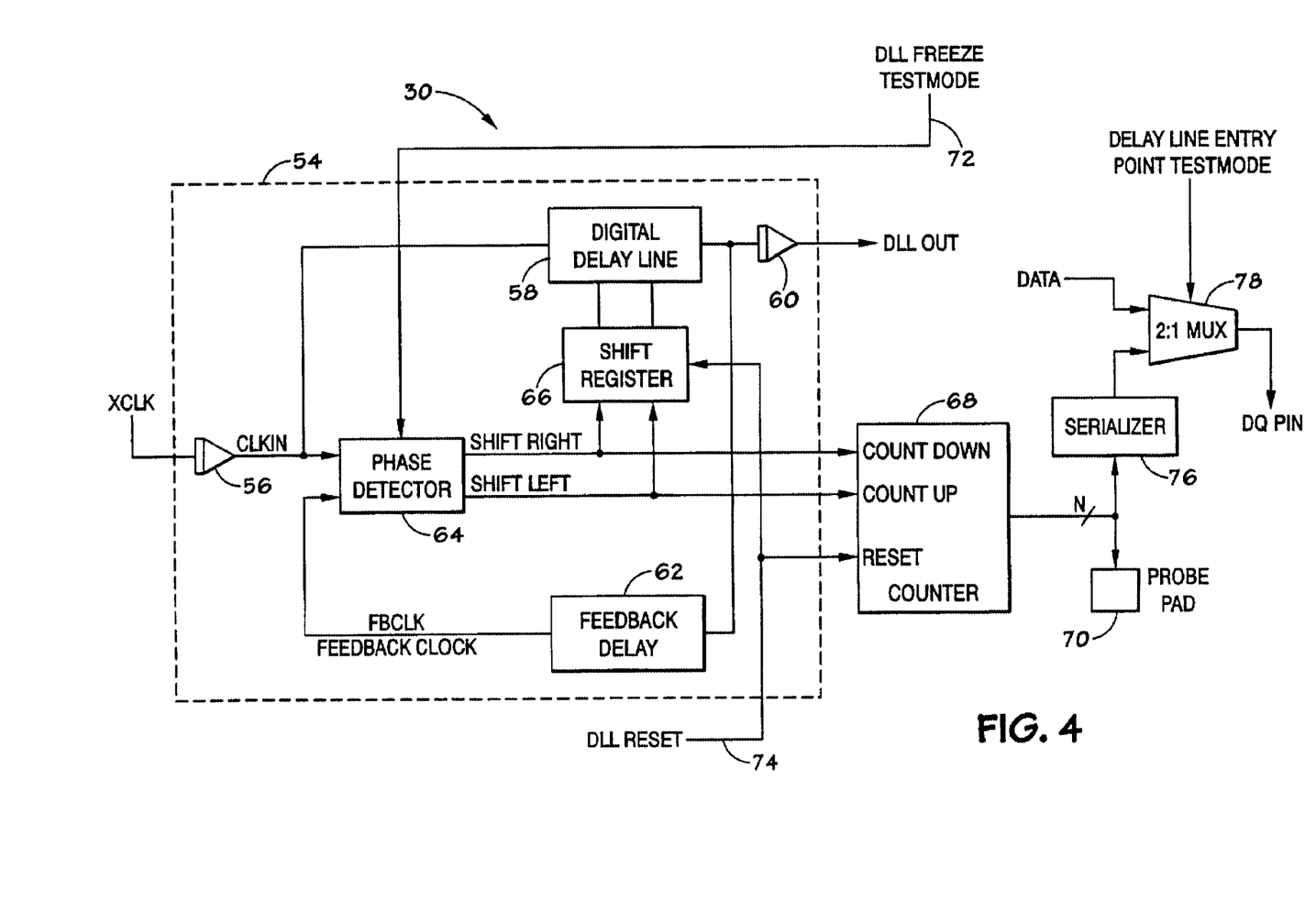
FIG. 4 illustrates one embodiment of a technique for characterizing a packaged delay locked loop memory device.

FIG. 4 illustrates one embodiment of a technique for characterizing a packaged SDRAM. For simplicity and cohesion, elements similar to those discussed previously are illustrated with like reference numerals. As previously discussed, the SDRAM 30 may include a DLL circuit 54. The DLL circuit 54 may include a delay line 58, a feedback delay circuit 62, a phase detector 64, and a shift register 66. In addition, the DLL 54 may include input and output buffers 56 and 60. To implement characterization of the entry point, a counter 68 is provided on the SDRAM 30. The counter 68 is coupled to the phase detector 64 and receives the same signals from the phase detector 64 (Shift Right and Shift Left) as the shift register 66. Each time the phase detector 64 indicates that the shift register 66 should shift the entry point in the delay line 58, the counter 68 is incremented or decremented to track the shifting of the entry point from one delay element 59 (illustrated in FIG. 3) to another. The entry point data accumulated in the counter 68 may be coupled to a probe pad 70. The probe pad 70 may be routed to a pin or may be accessible by an automated probe. By routing the information to a probe pad 70, the entry point information can automatically be sampled from each device. A plurality of probe pads 70 may be incorporated to monitor the individual bits of the parallel output coming from the counter 68.

The counter 68 may be used in several different ways. By incorporating a Testmode signal 72 from a test device to the phase detector 64, the phase detector 64 can be disabled thereby "freezing" the entry point data. By disabling the phase detector 64, the entry point information on the output of the phase detector 64 can be determined at any time during the operation of the DLL circuit 54. Alternatively, the Testmode signal 72 can remain enabled. In this case, the entry point can be monitored at the probe pad 70 from initialization through the locking of the DLL circuit 54. By providing a Testmode signal 72, the implementation of the counter 68 is more versatile. Further, a DLL Reset signal 74 may also be provided. Upon initialization of the DLL circuit 54, the DLL Reset signal 74 resets the counter 68 to zero and resets the delay line 58 to some known initial state.

Additionally, a serializer 76 may be incorporated to receive the output of the counter 68. The serializer 76 may include one or more latches to store the entry point information obtained from the counter 68. The information can then be clocked out from the serializer 76 to collect the entry point information for each SDRAM 30. The serialized data can then be used to provide characterization data for a particular design iteration. A multiplexor 78 may be used to provide an alternate output to a data (DQ) pin. When the DLL circuit 54 is in Entry Point Testmode (i.e. determining the entry point of the DLL circuit 54), the multiplexor 78 will provide the data from the serializer 76 to the DQ pin. During a normal mode of operation for the DLL circuit 54, the multiplexor 78 will send the normal SDRAM DATA signal.

Figure 5:
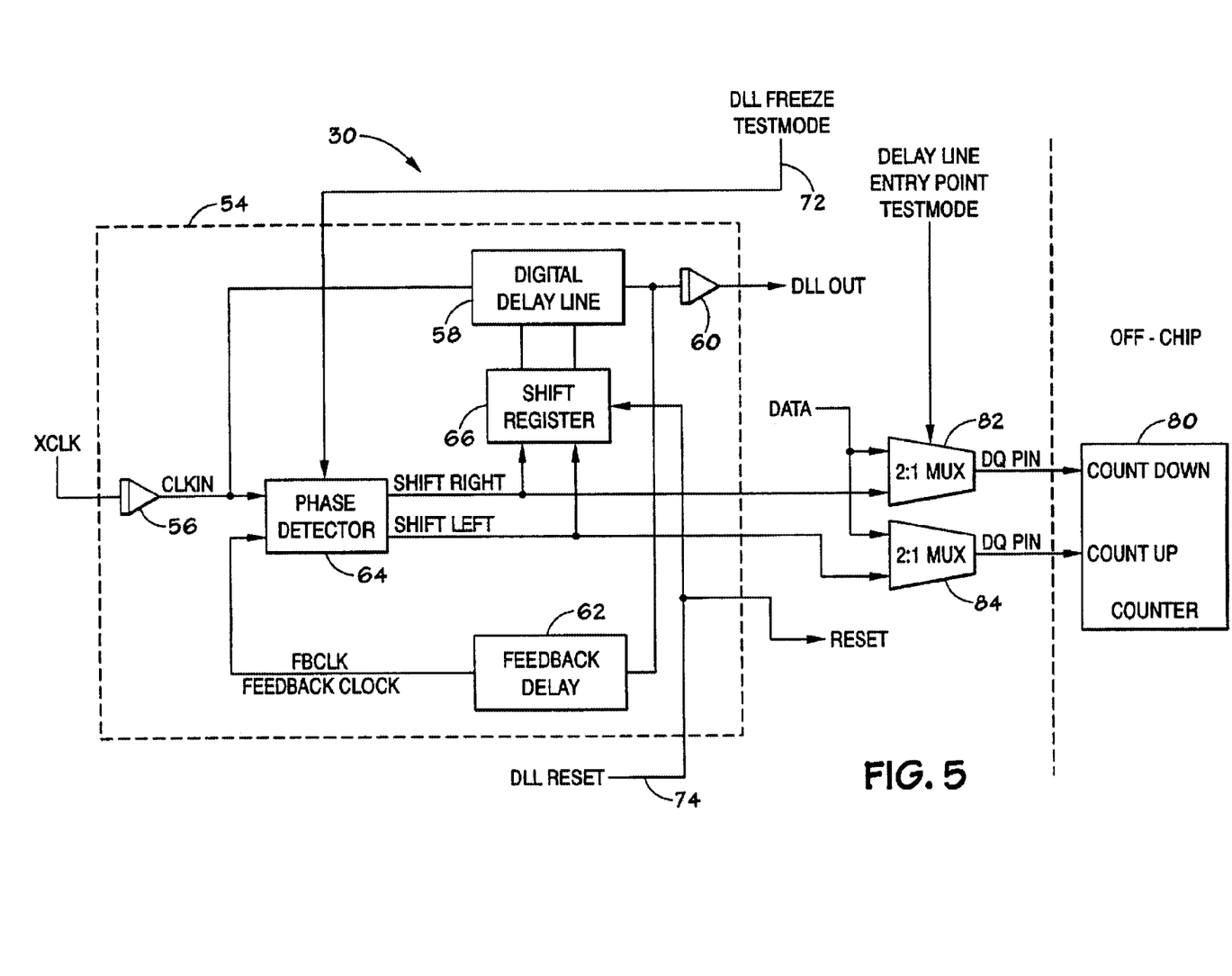
FIG. 5 illustrates an alternate embodiment of a technique for characterizing a packaged delay locked loop.

FIG. 5 illustrates an alternate embodiment of the technique described with reference to FIG. 4. As discussed with reference to FIG. 4, the SDRAM 30 may include a DLL circuit 54. The DLL 54 may include a delay line 58, a feedback delay circuit 62, a phase detector 64, and a shift register 66. In addition, the DLL 54 may include input and output buffers 56 and 60. To implement the characterization of the entry point, a counter 80 is located externally with respect to the SDRAM 30. The counter 80 may be part of the test equipment or may be located in another portion of the system, external to the SDRAM 30. The Shift Left and Shift Right signals which are delivered to the shift register 66 are delivered to multiplexors 82 and 84, respectively. Each multiplexor 82 and 84 also receives the DATA signal. Each time the phase detector 64 delivers a Shift Left or Shift Right signal to the multiplexors 82 and 84, the data is sent to a data (DQ) pin and on to the counter 80 for tracking the entry point. During normal operation, the SDRAM DATA is delivered through the multiplexors 82 and 84 to the DQ pins.

As with the on-chip counter design described with reference to FIG. 4, a Testmode signal 72 from a test device to the phase detector 64, can be used to disable the phase detector 64 and freeze the entry point information on the output of the phase detector 64 to be sampled at any time during the operation of the DLL circuit 54. Further, a DLL Reset signal 74 may also be provided. Upon initialization of the DLL circuit 54, the DLL Reset signal 74 resets the delay line 58 to some known initial state. The DLL Reset signal 74 may also be coupled to the external counter 80 to reset the counter 80 upon initialization of the DLL circuit 54. However, the external counter 80 may be reset externally instead.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of producing a plurality of memory devices comprising the acts of:
   electrically testing a portion of the plurality of memory devices, each of the memory devices comprising a delay locked loop (DLL) circuit;
   characterizing the DLL circuits based on the electrical testing of the portion of the plurality of memory devices;
   producing characterization data corresponding to a locking point of the DLL circuit; and
   redesigning the plurality of memory devices based on the characterization data.

2. The method of producing a plurality of memory devices, as set forth in claim 1, wherein the act of electrically testing the memory devices is repeated over a variety of conditions.

3. The method of producing a plurality of memory devices, as set forth in claim 2, wherein the conditions comprise temperatures.

4. The method of producing a plurality of memory devices, as set forth in claim 2, wherein the conditions comprise voltages.

5. A method of manufacturing a memory device comprising:
   providing a delay locked loop (DLL) circuit, wherein providing the DLL circuit comprises:
      providing a digital delay line comprising a plurality of delay elements configured to receive an input signal and to produce an output signal, and wherein the input signal has a first phase and the output signal has a second phase;
      providing a phase detector configured to receive the input signal and the output signal and further configured to compare the first phase and the second phase and to produce a shift command output based on the comparison between the first phase and the second phase; and
      providing a shift register coupled between the phase detector and the digital delay line and configured to shift the input signal by an amount of time equivalent to one delay element in response to the shift command output from the phase detector; and
   providing a counter coupled to the DLL circuit and configured to track an amount of added delay in the DLL circuit.

6. The method of manufacturing the memory device, as set forth in claim 5, wherein providing a digital delay line comprising a plurality of delay elements configured to receive an input signal comprises providing providing a digital delay line comprising a plurality of delay elements configured to receive a clock signal, the clock signal being generated by a device external to the memory device.

7. The method of manufacturing the memory device, as set forth in claim 5, wherein the clock signal comprises a buffered clock signal.

8. The method of manufacturing the memory device, as set forth in claim 5, wherein providing the DLL circuit providing a feedback delay line and wherein the output signal is delivered from the digital delay line to the phase detector through the feedback delay line.

9. The method of manufacturing the memory device, as set forth in claim 5, wherein providing the shift register and providing the counter comprises providing a shift register and a counter, wherein each of the shift register and the counter is configured to be initialized to a known state when the DLL circuit receives a RESET command.

10. The method of manufacturing the memory device, as set forth in claim 5, wherein providing the DLL circuit comprises providing a DLL circuit configured to achieve a locking point of the DLL circuit when the first phase is equal to the second phase.

11. The method of manufacturing the memory device, as set forth in claim 10, wherein the locking point of the DLL circuit corresponds to an amount of added delay in the input signal.

12. The method of manufacturing the memory device, as set forth in claim 11, wherein the amount of added delay is correlative to a number of delay elements in the delay line.

13. The method of manufacturing the memory device, as set forth in claim 12, wherein providing the counter comprises providing a counter configured to track the amount of added delay by counting the number of delay elements used to add the amount of delay corresponding to the locking point of the DLL circuit.

14. The method of manufacturing the memory device, as set forth in claim 13, comprising providing a probe pad on the memory device, wherein the probe pad is configured to receive an output signal from the counter, the output signal comprising information corresponding to the amount of added delay.

15. The method of manufacturing the memory device, as set forth in claim 13, comprising providing a serializer on the memory device, wherein the serializer is configured to receive and store an output signal from the counter, the output signal comprising information corresponding to the amount of added delay.

16. The method of manufacturing the memory device, as set forth in claim 15, comprising providing a multiplexor on the memory device, wherein the multiplexor is configured to receive an output signal from the serializer corresponding to the amount of added delay and further configured to toggle between a test mode of operation in which the output signal from the counter is passed through the multiplexor and to additional system components and a normal mode of operation in which memory data is passed through the multiplexor and to additional system components.

17. A method of manufacturing a memory device comprising;
    providing a delay locked loop (DLL) circuit, wherein providing the DLL circuit comprises:
        providing a digital delay line having an input and an output and comprising a plurality of delay elements, each delay element having a corresponding entry point;
        providing a phase detector coupled to the input and the output of the digital delay line; and
        providing a shift register coupled between the phase detector and the digital delay line and configured to shift to each of the delay element entry points; and
    providing a counter coupled to the DLL circuit.

18. The method of manufacturing a memory device, as set forth in claim 17, wherein providing the digital delay line comprises providing a digital delay line configured to receive an input signal delivered to the input of the digital delay line, the input being generated by a device external to the memory device.

19. The method of manufacturing a memory device, as set forth in claim 18, wherein input signal comprises a clock signal.

20. The method of manufacturing a memory device, as set forth in claim 18, wherein providing the DLL circuit comprises providing a DLL circuit configured to achieve a locking point of the DLL circuit when the phase at the input signal is equal to the phase of the output of the digital delay line.

21. The method of manufacturing a memory device, as set forth claim 20, wherein the locking point of the DLL circuit corresponds to an amount of delay added to the phase of the input signal.

22. The method of manufacturing a memory device, as set forth in claim 21, wherein the amount of delay added is correlative to a number of delay elements in the delay line.

23. The method of manufacturing the memory device, as set forth in claim 22, wherein providing the counter comprises providing a counter configured to track the amount of added delay by counting the number of delay elements used to add the amount of delay corresponding to the locking point of the DLL circuit.

24. The method of manufacturing the memory device, as set forth in claim 23, comprising providing a probe pad on the memory device, wherein the probe pad is configured to receive an output signal from the counter, the output signal comprising information corresponding to the amount of added delay.

25. The method of manufacturing the memory device, as set forth in claim 23, comprising providing a serializer on the memory device, wherein the serializer is configured to receive and store an output signal from the counter, the output signal comprising information corresponding to the amount of added delay.

26. The method of manufacturing the memory device, as set forth in claim 17, wherein providing the DLL circuit comprises providing a feedback delay line and wherein the output signal is delivered from the digital delay line to the phase detector through the feedback delay line.

27. The method of manufacturing the memory device, as set forth in claim 17, wherein providing the shift register and providing the counter comprises providing a shift register and a counter, wherein each of the shift register and the counter is configured to be initialized to a known state when the DLL circuit receives a RESET command.

* * * * *